US010133689B2

(12) United States Patent
Kim et al.

(10) Patent No.: US 10,133,689 B2
(45) Date of Patent: Nov. 20, 2018

(54) ELECTRONIC DEVICE AND METHOD FOR FABRICATING THE SAME

(71) Applicant: SK hynix Inc., Icheon-Si (KR)

(72) Inventors: Guk-Cheon Kim, Icheon-si (KR); Yang-Kon Kim, Icheon-Si (KR); Seung Mo Noh, Icheon-Si (KR); Won-Joon Choi, Icheon-Si (KR)

(73) Assignee: SK hynix Inc., Icheon-si (KR)

( * ) Notice: Subject to any disclaimer, the term of this patent is extended or adjusted under 35 U.S.C. 154(b) by 291 days.

(21) Appl. No.: 15/081,484

(22) Filed: Mar. 25, 2016

(65) Prior Publication Data

US 2017/0024336 A1 Jan. 26, 2017

(30) Foreign Application Priority Data

Jul. 24, 2015 (KR) .................. 10-2015-0104875

(51) Int. Cl.
*G11C 11/16* (2006.01)
*G06F 13/16* (2006.01)
(Continued)

(52) U.S. Cl.
CPC ...... *G06F 13/1673* (2013.01); *G06F 12/0802* (2013.01); *G06F 13/4282* (2013.01);
(Continued)

(58) Field of Classification Search
CPC .............................. G11C 11/15; G11C 11/161
See application file for complete search history.

(56) References Cited

U.S. PATENT DOCUMENTS

2011/0260272 A1* 10/2011 Lee .................. B82Y 25/00
257/421
2012/0012955 A1 1/2012 Ito et al.
(Continued)

FOREIGN PATENT DOCUMENTS

KR 10-2002-0055448 A 7/2002

OTHER PUBLICATIONS

Parkin, S.S.P, Systematic Variation of the Strength and Osciiiation Period of Indirect Magnetic Exchange Coupling through the 3d, 4d, and 5d Transition Metals, Physical Review Letters 67(25):3598-3601, Dec. 16, 1991.

*Primary Examiner* — Hoai V Ho
*Assistant Examiner* — Jay Radke
(74) *Attorney, Agent, or Firm* — Perkins Coie LLP

(57) ABSTRACT

This technology provides a method for fabricating an electronic device. A method for fabricating an electronic device including a variable resistance element, which includes a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer.

19 Claims, 9 Drawing Sheets

(51) Int. Cl.
    *H01L 43/08*     (2006.01)
    *H01L 43/10*     (2006.01)
    *G06F 13/42*     (2006.01)
    *G11C 11/15*     (2006.01)
    *H01L 27/22*     (2006.01)
    *G06F 12/0802*     (2016.01)
    *H01L 43/12*     (2006.01)

(52) U.S. Cl.
    CPC ............ *G11C 11/15* (2013.01); *G11C 11/161* (2013.01); *H01L 27/222* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 2012/0261777 A1* | 10/2012 | Shukh | H01L 43/08 257/421 |
| 2012/0300542 A1* | 11/2012 | Uchida | G11C 11/161 365/171 |
| 2014/0015076 A1* | 1/2014 | Gan | H01L 43/08 257/421 |
| 2014/0241040 A1* | 8/2014 | Jeong | G11C 11/5607 365/148 |
| 2016/0005449 A1* | 1/2016 | Carey | G11C 11/161 257/421 |

* cited by examiner

ELECTRONIC DEVICE AND METHOD FOR FABRICATING THE SAME

CROSS-REFERENCE TO RELATED APPLICATION

This patent document claims priority of Korean Patent Application No. 10-2015-0104875, entitled "METHOD FOR FABRICATING ELECTRONIC DEVICE" and filed on Jul. 24, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, a method for fabricating an electronic device including a variable resistance element, which includes a free layer formed over a substrate and having a variable magnetization direction, a pinned layer having a pinned magnetization direction, a tunnel barrier layer interposed between the free layer and the pinned layer, a magnetic correction layer to have a magnetization direction opposite to the pinned magnetization direction of the pinned layer to reduce an influence of a stray magnetic field generated by the pinned layer, and a spacer layer interposed between the magnetic correction layer and the pinned layer and providing an anti-ferromagnetic exchange coupling between the magnetic correction layer and the pinned layer, wherein the method comprises cooling the substrate before forming the spacer layer so as to form the spacer layer over the cooled substrate.

Implementations of the above method may include one or more the following.

The cooling of the substrate is performed in a first stage chamber within the first temperature range. The first temperature range is about 0° C. or below. The forming of the spacer layer is performed in a second stage chamber having a second temperature higher than the first temperature range. The second temperature is room temperature. At least one of forming of the free layer, forming of the pinned layer and forming of the magnetic correction layer is performed in a second stage chamber having a second temperature higher than the first temperature range. The second temperature is room temperature. At least one of the forming of the free layer, the forming of the pinned layer and the forming the magnetic correction layer is performed by a rotational deposition method. The cooled substrate operates to suppress a generation of a mixing layer between the spacer layer and the magnetic correction layer, or between the spacer layer and the pinned layer. The spacer layer comprises a metallic nonmagnetic material. At least one of the pinned layer and the magnetic correction layer comprises: a plurality of ferromagnetic materials, and a spacer interposed between adjacent two ferromagnetic materials among the ferromagnetic materials and providing an exchange coupling with a spring magnet mechanism between the two adjacent ferromagnetic materials. A ferromagnetic material which is the most adjacent to the spacer layer among the ferromagnetic materials has a thickness greater than a thickness of each of remaining ferromagnetic materials. The free layer, the pinned layer and the magnetic correction layer have a magnetization direction perpendicular to surfaces of the free layer, and wherein a magnetization direction of the pinned layer is anti-parallel to a magnetization direction of the magnetic correction layer.

In another aspect, a method for fabricating an electronic device comprising a SAF (synthetic antiferromagnetic) structure including a spacer interposed between a first ferromagnetic material and a second ferromagnetic material, may include: providing a substrate; forming at least one of the first ferromagnetic material and the second ferromagnetic material under a first temperature; cooling the substrate to a second temperature lower than the first temperature; and forming the spacer over the cooled substrate.

Implementations of the above method may include one or more the following.

The first temperature is room temperature, and the second temperature is about 0° C. or below. The forming the spacer is performed under a third temperature higher than the second temperature. The third temperature is room temperature. The forming at least one the first ferromagnetic material and the second ferromagnetic material is performed by a rotational deposition method. The cooled substrate operates to suppress a generation of a mixing layer between the spacer and at least one of the first ferromagnetic material and the second ferromagnetic material. The spacer comprises a metallic nonmagnetic material.

In another aspect, an electronic device comprising a semiconductor memory which includes: a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer.

Implementations of the above device may include one or more the following.

Each of the first ferromagnetic materials has the first magnetization direction. The first spacer layer provides an exchange coupling with a spring magnet mechanism between the first ferromagnetic materials. A first ferromagnetic material which is the most adjacent to the third spacer layer among the first ferromagnetic materials has a thickness larger than a thickness of each of remaining first ferromagnetic materials. The magnetic correction layer includes a plurality of second ferromagnetic materials and a second spacer layer interposed between adjacent two second ferromagnetic materials among the second ferromagnetic materials. Each of the second ferromagnetic materials has the second magnetization direction. The second spacer layer provides an exchange coupling with a spring magnet mechanism between the second ferromagnetic materials. A second ferromagnetic material which is the most adjacent to the third spacer layer among second first ferromagnetic materials has a thickness greater than a thickness of each of remaining second ferromagnetic materials. At least one of the first spacer layer, the second spacer layer and the third spacer layer comprises a metallic nonmagnetic material. The electronic device further comprising mixing layers formed at interfaces between any two adjacent layers among the free layer, the pinned layer, the tunnel barrier layer, the magnetic correction layer, and the third spacer layer, wherein a thickness of the mixing layer formed at the interface between the third spacer layer and the pinned layer or between the third spacer layer and the magnetic correction layer is smaller than a thickness of each of other mixing layers. A roughness at an interface between the third spacer layer and the pinned layer or between the third spacer layer and the magnetic correction layer is smaller than a roughness at another interface. The free layer, the pinned layer and the magnetic correction layer have a magnetization direction perpendicular to surfaces of the layers, respectively.

In another aspect, an electronic device comprising a semiconductor memory which includes: a free layer having a variable magnetization direction; a pinned layer having a first magnetization direction which is pinned; a tunnel barrier layer interposed between the free layer and the pinned layer; a magnetic correction layer having a second magnetization direction which is anti-parallel to the first magnetization direction, and including a plurality of second ferromagnetic materials and a second spacer layer interposed between adjacent two second ferromagnetic materials among the second ferromagnetic materials; and a third spacer layer interposed between the magnetic correction layer and the pinned layer, and providing an anti-ferromagnetic exchange coupling between the magnetic correction layer and the pinned layer.

Implementations of the above device may include one or more the following.

Each of the second ferromagnetic materials has the second magnetization direction. The second spacer layer provides an exchange coupling with a spring magnet mechanism between the second ferromagnetic materials. A second ferromagnetic material which is the most adjacent to the third spacer layer among second first ferromagnetic materials has a thickness larger than a thickness of each of remaining second ferromagnetic materials.

In another aspect, an electronic device comprising a semiconductor memory which includes: a substrate; a MTJ (Magnetic Tunnel Junction) structure formed over the substrate and including a free layer having a variable magnetization direction, a pinned layer having a non-variable magnetization direction, and a tunnel barrier layer formed between the free layer and the pinned layer; a magnetic correction layer facing the pinned layer of the MTJ structure and having a magnetization direction that allows to reduce an influence of a magnetic field generated by the pinned layer; and a spacer layer formed between the pinned layer and the magnetic correction layer and having a RMS (Root Mean Square) roughness equal to or less than 0.3 nm.

Implementations of the above device may include one or more the following.

Between the pinned layer and the magnetic correction layer, an exchange coupling is provided that is sufficient for the pinned layer and the magnetic correction layer to maintain an anti-parallel state in the magnetization direction. Between the pinned layer and the magnetic correction layer, an exchange coupling is provided that is sufficient for the pinned layer to maintain a perpendicular anisotropy. Between the pinned layer and the magnetic correction layer, an exchange coupling is provided, which is greater than that generated when the spacer layer has the RMS roughness greater than 0.3 nm. The exchange coupling provides an exchange coupling constant Jex which increases by up to 30% as compared to that when the spacer layer has the RMS roughness greater than 0.3 nm. The pinned layer has a relatively small thickness as compared when the spacer layer has the RMS roughness greater than 0.3 nm.

The free layer and the pinned layer include a ferromagnetic material. The magnetic correction layer includes a ferromagnetic material. At least one of the pinned layer and the magnetic correction layer comprises: ferromagnetic materials, and a spacer interposed between adjacent two ferromagnetic materials.

In another aspect, an electronic device comprising a semiconductor memory which includes: a substrate; a SAF (Synthetic Antiferromagnetic) structure formed over the substrate and including a first ferromagnetic material, a second ferromagnetic material, and a spacer layer formed between the first and second ferromagnetic materials, wherein the spacer layer has a RMS (Root Mean Square) roughness equal to or less than 0.3 nm.

Implementations of the above device may include one or more the following.

An exchange coupling between the first ferromagnetic material and the second ferromagnetic material is sufficiently strong such that the the first ferromagnetic material maintains an anti-parallel state with the second ferromagnetic material. An exchange coupling between the first ferromagnetic material and the second ferromagnetic material is greater than that generated when the spacer layer has the RMS roughness greater than 0.3 nm. The SAF structure has a relatively small size as compared when the spacer layer has the RMS roughness greater than 0.3 nm.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1:
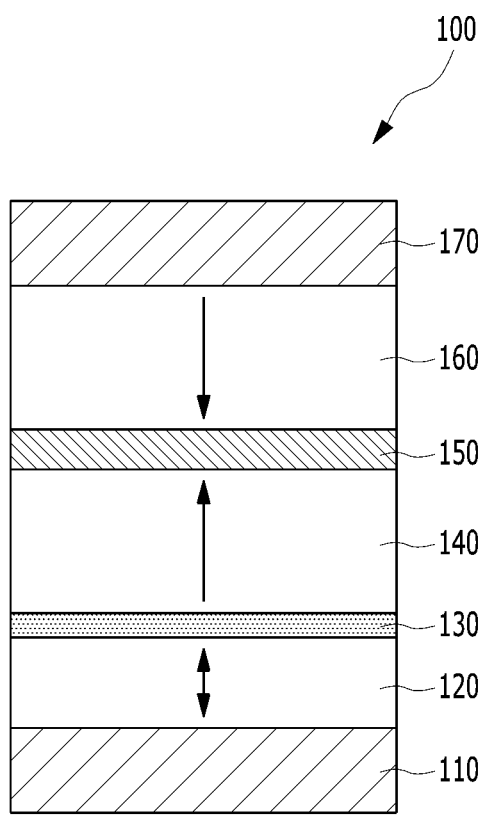
FIG. 1 is a cross-sectional view illustrating an exemplary variable resistance element in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating an exemplary variable resistance element in accordance with an implementation of the present disclosure.

Referring to FIG. 1, a variable resistance element 100 in accordance with an implementation of the present disclosure may include a under layer 110, a free layer having a variable magnetization direction and disposed over the under layer 110, a tunnel barrier layer 130 disposed over the free layer 120, a pinned layer 140 having a pinned magnetization direction and disposed over the tunnel barrier layer 130, a spacer layer 150 disposed over the pinned layer 140, a magnetic correction layer 160 disposed over the spacer layer 150, and a capping layer 170 disposed over the magnetic correction layer 160. Here, the free layer 120, the pinned layer 140 and the tunnel barrier layer 130 formed between the free layer 120 and the pinned layer 140 may be referred to as an MTJ (Magnetic Tunnel Junction) structure.

In the MTJ structure, since the magnetization direction of the free layer 120 is variable, the free layer 120 may practically store different data according to its magnetization direction, and be referred to as a storage layer, etc. The magnetization direction of the free layer 120 may be changed by spin transfer torque. Since the magnetization direction of the pinned layer 140 is pinned, the pinned layer 140 may be compared with the free layer 120, and be referred to as a reference layer, etc. The tunnel barrier layer 130 may change the magnetization direction of the free layer 120 by tunneling of electrons during a writing operation. The free layer 120 and the pinned layer 140 may have the magnetization direction perpendicular to top surfaces of the free layer 120 and the pinned layer 140, respectively. For example, as shown by arrows, the magnetization direction of the free layer 120 may be changed between a downward direction and an upward direction, and the magnetization direction of the pinned layer 140 may be fixed to an upward direction.

According to a voltage or current applied to the variable resistance element 100, the magnetization direction of the free layer 120 may be changed so as to be parallel or anti-parallel to the magnetization direction of the pinned layer 140. As a result, the variable resistance element 100 may be switched between a low resistance state and a high resistance state to store different data. In this manner, the variable resistance element 100 may serve as a memory cell.

Each of the free layer 120 and the pinned layer 140 may have a single-layered structure or a multi-layered structure including a ferromagnetic material. For example, each of the free layer 120 and the pinned layer 140 may include an alloy of which a main component is Fe, Ni or Co, such as a Co—Fe—B alloy, Co—Fe—B—X alloy (Here, X may be Al, Si, Ti, V, Cr, Ni, Ga, Ge, Zr, Nb, Mo, Pd, Ag, Hf, Ta, W or Pt), an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. Alternatively, each of the free layer 120 and the pinned layer 140 may include a stack structure of Co/Pt, or Co/Pd, etc., or an alternate stack structure of a magnetic material and a non-magnetic material. The tunnel barrier layer 130 may include an insulating oxide, for example, MgO, CaO, SrO, TiO, VO, or NbO, etc.

In some implementations, the variable resistance element 100 may further include one or more additional layers performing various functions to improve a characteristic of the MTJ structure. In this implementation, the additional layers are exemplified in the under layer 110, the spacer layer 150, the magnetic correction layer 160 and the capping layer 170, however, the present disclosure is not limited thereto.

The under layer 110 may serve to improve a perpendicular anisotropy, etc. of the layer disposed over the under layer 110, such as the free layer 120. The under layer 110 may have a single-layered structure or a multi-layered structure including a conductive material such as a metal, metal nitride, etc.

The magnetic correction layer 160 may serve to offset or reduce an influence of a stray magnetic field generated by the pinned layer 140. In this case, the influence of stray magnetic field of the pinned layer 140 on the free layer 120 may be reduced, thereby reducing a bias magnetic field in the free layer 120. The magnetic correction layer 160 may have a magnetization direction anti-parallel to the magnetization direction of the pinned layer 140. In this implementation, when the pinned layer 140 has an upward magnetization direction, the magnetic correction layer 160 may have a downward magnetization direction. On the contrary, when the pinned layer 140 has a downward magnetization direction, the magnetic correction layer 160 may have an upward magnetization direction. The magnetic correction layer 160 may have a single-layered structure or a multi-layered structure including a ferromagnetic material.

The spacer layer 150 may be interposed between the magnetic correction layer 160 and the pinned layer 140 and serve to provide an antiferromagnetic exchange coupling therebetween. The spacer layer 150 may include a metallic nonmagnetic material, for example, Cr, Ru, Ir, or Rh, etc.

The capping layer 170 may function as a hard mask during patterning of the variable resistance element 100 and include various conductive materials such as a metal, etc.

Meanwhile, as an integration degree of a semiconductor device including the variable resistance element 100 described as above increases, an area provided for the variable resistance element 100 becomes decreasing. In this case, in order to maintain an influence of the magnetic correction layer 160 on the pinned layer 140, a thickness of the magnetic correction layer 160 tends to be increased. However, increasing a thickness of the magnetic correction layer 160 may cause patterning of the variable resistance element 100 to become difficult. As an another approach to reduce a stray magnetic field generated by the pinned layer 140, a thickness of the pinned layer 140 may be decreased. This approach, however, causes a perpendicular anisotropy of the pinned layer 140 to be attenuated.

In recognition of the problems above, the implementation below is provided and can be used in a way for mitigating such problems or reducing the undesired effects. For example, the disclosed implementation can be used to maintain a perpendicular anisotropy of the pinned layer 140 even when a thickness of the pinned layer 140 decreases, by generating a strong exchange coupling between the pinned layer 140 and the magnetic correction layer 160. This is based on that a perpendicular anisotropy of the pinned layer 140 is proportional to an exchange coupling with the magnetic correction layer 160. Thus, it is possible to maintain an anti-parallel state of the magnetization direction of the pinned layer 140 and magnetic correction layer 160. In this way, a thickness of the pinned layer 140 can be reduced. Thus, a bias magnetic field of the free layer 120 can be sufficiently reduced without increasing a thickness of the magnetic correction layer 160. Further, a strong exchange coupling between the pinned layer 140 and the magnetic correction layer 160 may result in omitting an additional initialization process for making the magnetization direction of the pinned layer 140 anti-parallel to the magnetization direction of the magnetic correction layer 160 and preventing an error of switching the pinned layer 140 during switching the free layer 120.

A method for generating a strong exchange coupling between the pinned layer 140 and the magnetic correction layer 160 will be explained in detail with reference to FIG. 2.

Figure 2:
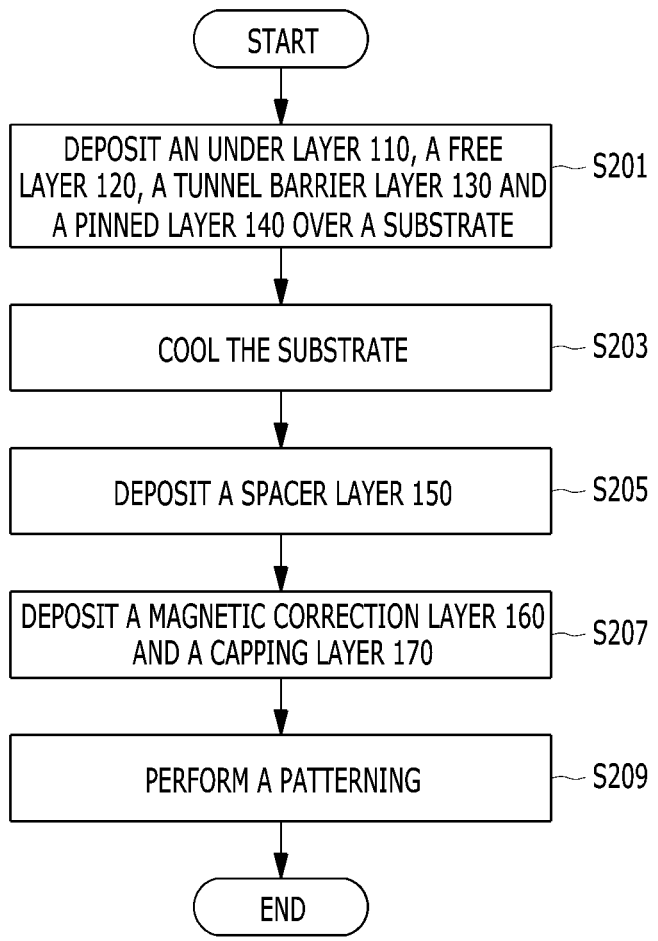
FIG. 2 is a cross-sectional view illustrating an example of a method for fabricating the variable resistance element shown in FIG. 1.

FIG. 2 is a cross-sectional view illustrating an example of a method for fabricating the variable resistance element of FIG. 1.

Referring to FIG. 2, firstly, over a substrate (not shown), the under layer 110, the free layer 120, the tunnel barrier layer 130 and the pinned layer 140 may be sequentially deposited (S201).

Here, the free layer 120 and the pinned layer 140 which include a ferromagnetic material may be formed by using a PVD (Physical Vapor Deposition) process. Since a ferromagnetic material generally consists of or includes various elements, in a PVD process for forming the free layer 120 and the pinned layer 140, various targets having a small size may be used and the free layer 120 and the pinned layer 140 may be deposited while the substrate rotates. Further, the PVD process for forming the free layer 120 and the pinned layer 140 may be performed at a relatively high temperature, for example, in a room temperature stage chamber. There may exist a processing limitation such as difficulties in performing a rotational deposition, in case of using a low temperature stage chamber, for example, at a temperature of −100° C. or below.

Subsequently, the substrate over which the under layer 110, the free layer 120, the tunnel barrier layer 130 and the pinned layer 140 are deposited may be transferred to a stage chamber at a relatively low temperature, for example, at a temperature of 0° C. or below. By doing so, the substrate can be cooled (S203).

Next, the spacer layer 150 may be deposited over the cooled substrate (S205).

The spacer layer 150 may be formed by a PVD process. Here, the deposition of the spacer layer 150 may be performed in a state where the cooled substrate is in the low temperature stage chamber. Alternatively, the deposition of the spacer layer 150 may be performed after the cooled substrate is transferred to the room temperature stage chamber. Since a temperature of the substrate may maintain for a given time even after the cooled substrate is transferred to the room temperature stage chamber, even when the deposition of the spacer layer 150 is performed after the substrate is transferred to the room temperature stage chamber, the spacer layer 150 can be deposited over the substrate which is maintained in a cooled state in the room temperature stage chamber. In the case that the spacer layer 150 is deposited after the cooled substrate is transferred to the room temperature stage chamber, the deposition process can be performed without any processing limitations. For example, it is also possible to perform the rotational deposition in the room temperature stage chamber.

Subsequently, the magnetic correction layer 160 and the capping layer 170 may be sequentially deposited over the spacer layer 150 (S207).

Here, the magnetic correction layer 160 including a ferromagnetic material may be formed through a rotational deposition method by using a PVD process. The deposition of the magnetic correction layer 160 may be performed in the room temperature stage chamber. When the spacer layer 150 is deposited in the low temperature stage chamber, the deposition of the magnetic correction layer 160 may be performed after transferring the substrate to the room temperature stage chamber. In this case, the magnetic correction layer 160 may be deposited either in a state where the cooled substrate is maintained in the room temperature stage chamber or in a state where the temperature of the substrate increases without maintaining the cooled state.

Next, the variable resistance element 100 may be formed by patterning the deposited under layer 110, the free layer 120, the tunnel barrier layer 130, the pinned layer 140, the spacer layer 150, the magnetic correction layer 160 and the capping layer 170 (S209). In some implementations, the variable resistance element 100 is formed in a column shape as shown in FIG. 1.

As described above, when the spacer layer 150 is deposited over the cooled substrate, an exchange coupling between the pinned layer 140 and the magnetic correction layer 160 can become strong. This is due to the fact that electrons sputtered during the deposition of the spacer layer 150 has a low thermal energy when reaching an upper portion, e.g., atop, of the pinned layer 140. Thus, the generation of a mixing or interfacing layer at an interface between the spacer layer 150 and the pinned layer 140 can be suppressed and a roughness at another interfacing or mixing layer, the interface between the spacer layer 150 and the pinned layer 140, can be reduced, thereby preventing deterioration of a magnetic characteristic.

In general, the mixing or interfacing layer is generated at an interface of any two layers that are adjacent to each other in the variable resistance element 100. In some implementations of the disclosed technology, the mixing layer formed at the interface between the spacer layer 150 and the pinned layer 140 has a thickness and a roughness smaller than those of other mixing layers formed at an interface between two adjacent layers deposited at a room temperature. For example, the mixing layer formed at the interface between the spacer layer 150 and the pinned layer 140 has a thickness and a roughness smaller than those of the mixing layer formed at an interface between the tunnel barrier layer 130 and the pinned layer 140.

Figure 3:
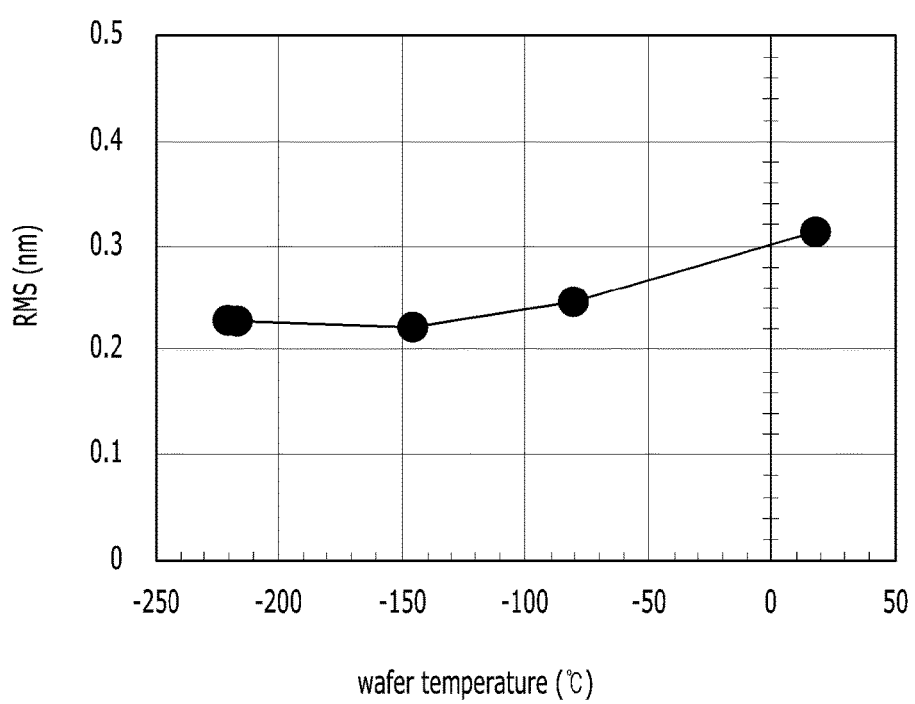
FIG. 3 is a graph of a RMS (Root Mean Square) value of a roughness of a spacer layer depending on temperature of a substrate.

FIG. 3 shows a graph of a RMS (Root Mean Square) value of a roughness of a spacer layer depending on temperature of a substrate over which the mixing layer is formed. As shown in FIG. 3, when the wafer is cooled to a lower temperature, e.g., below 0° C., the spacer layer 150 has a smaller roughness as compared to the layer roughness of the spacer layer 150 when the wafer is not cooled. For example, conducted tests show that a RMS (Root Mean Square) roughness of the spacer layer so formed may be equal to to or less than 0.3 nm. Under the condition of having a cooled substrate, the formation of the spacer layer 150 produces a less rough surface over which the magnetic correction layer 160 is subsequently formed. This condition thus generally reduces the layer roughness of both the spacer layer 150 and the magnetic correction layer 160. This reduced layer roughness achieved by cooling the substrate during fabrication can lead to improved exchange coupling between the magnetic correction layer 160 and the pinned layer 140.

Figure 4:
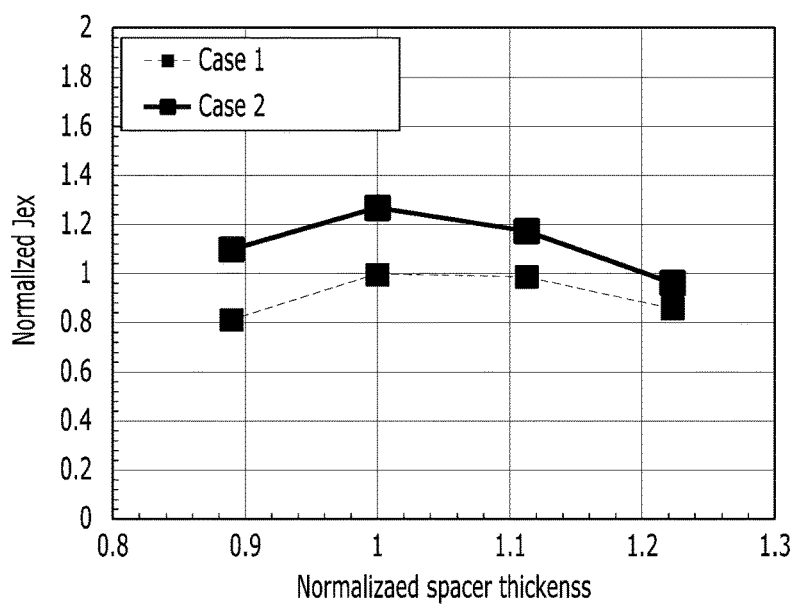
FIG. 4 is a diagram illustrating an exchange coupling constant Jex of a spacer layer shown in FIG. 2 according to a deposition temperature.

Tests were conducted to experimentally demonstrate that the exchange coupling between the pinned layer 140 and the magnetic correction layer 160 becomes strong when the spacer layer 150 is deposited over the cooled substrate. FIG. 4 is a diagram illustrating an exchange coupling constant Jex of the spacer layer shown in FIG. 2 according to a deposition temperature.

Referring to FIG. 4, case 1 shows a Jex value normalized when the spacer layer 150 was deposited in the room temperature stage chamber without cooling the substrate.

On the contrary, case 2 shows a Jex value normalized when the spacer layer 150 was deposited over the cooled substrate after the substrate was transferred to the low temperature stage chamber and cooled. For case 2, the Jex value was measured when the spacer layer 150 and the magnetic correction layer 160 were deposited over the cooled substrate after cooling the substrate by gradually lowering the temperature of the low temperature stage chamber from 0° C. to about −220° C. From the experiment, it was found that the Jex value increases proportionally to decrease in temperature of the temperature stage chamber while the temperature decreases to about −215° C., and then the Jex value becomes saturated without further decrease when the temperature is 215° C. or below. Referring to FIG. 3, the Jex value of case 2 increases by 30% at the maximum as compared with case 1.

Therefore, tests conducted demonstrate that cooling the substrate during the fabrication can improve both (1) the layer roughness of the spacer layer and the magnetic correction layer formed on the spacer layer and (2) the resultant exchange coupling strength between the pinned layer and the magnetic correction layer. Such improvements are measurable and thus are beneficial in obtaining improved device quality and data storage performance.

In the implementation shown in FIG. 1, the under layer 110, the free layer 120, the tunnel barrier layer 130, the pinned layer 140, the spacer layer 150, the magnetic correction layer 160, and the capping layer 170 are sequentially deposited over the substrate as shown and other ordering of the layers may also be possible. A stacking order of the layers in FIG. 1 may be changed provided that the tunnel barrier layer 130 is interposed between the free layer 120 and the pinned layer 140, and the spacer layer 150 is interposed between the pinned layer 140 and the magnetic correction layer 160. This will be exemplarily described with reference to FIG. 4.

Figure 5:
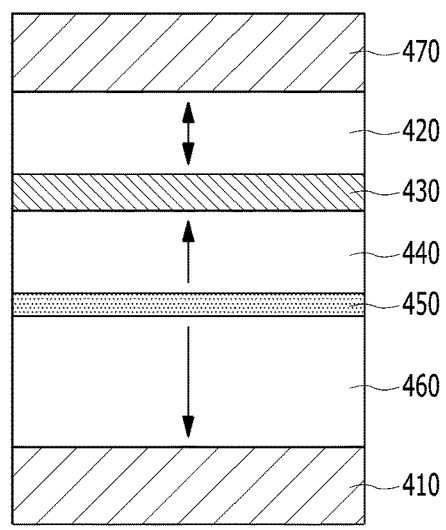
FIG. 5 is a cross-sectional view illustrating an exemplary variable resistance element in accordance with another implementation of the present disclosure.

FIG. 5 is a cross-sectional view illustrating an exemplary variable resistance element in accordance with another implementation of the present disclosure.

Referring to FIG. 5, a variable resistance element in accordance with another implementation of the present disclosure may include a under layer 410, a magnetic correction layer 460 disposed over the under layer 410, a spacer layer 450 disposed over the magnetic correction layer 460, a pinned layer 440 disposed over the spacer layer 450, a tunnel barrier layer 430 disposed over the pinned layer 440, a free layer 420 disposed over the tunnel barrier layer 430, and a capping layer 470 disposed over the free layer 420.

Here, the under layer 410, the free layer 420, the tunnel barrier layer 430, the pinned layer 440, the spacer layer 450, the magnetic correction layer 460 and the capping layer 470 may be formed of or include the same material and perform the same function as the under layer 110, the free layer 120, the tunnel barrier layer 130, the pinned layer 140, the spacer layer 150, the magnetic correction layer 160 and the capping layer 170 shown in FIG. 1, respectively. Also, the spacer layer 450 may be formed in a state where a substrate over which the under layer 410 and the magnetic correction layer 460 are formed is cooled. Therefore, a mixing layer at an interface between the spacer layer 450 and the magnetic correction layer 460 can be suppressed, and a roughness at the interface between the spacer layer 450 and the magnetic correction layer 460 can be reduced.

The variable resistance element in accordance with the implementations of the present disclosure, for example, the variable resistance element 100 of FIG. 1, may be provided in plural to form a cell array. The cell array may include various components such as lines, elements, etc. to drive the variable resistance element 100. This will be exemplarily described with reference to FIGS. 6 and 7.

Figure 6:
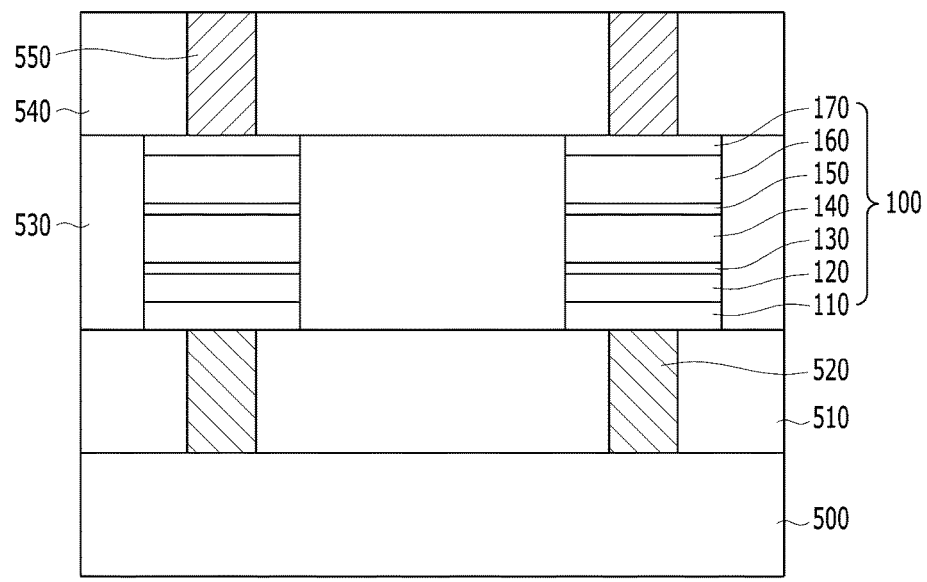
FIG. 6 is a cross-sectional view illustrating an exemplary memory device and a method for fabricating the same in accordance with an implementation of the present disclosure.

FIG. 6 is a cross-sectional view illustrating a memory device and a method for fabricating the same in accordance with an implementation of the present disclosure.

Referring to FIG. 6, the memory device of this implementation may include a substrate 500, a lower contact 520, a variable resistance element 100 and an upper contact 550.

The substrate 500 may include a specific structure (not shown) which is required, for example, a transistor controlling an access to the variable resistance element 100. The lower contact 520 may be disposed over the substrate 500, and couple a lower end of the variable resistance element 100 with a portion of the substrate 500, for example, a drain of the transistor. The upper contact 550 may be disposed over the variable resistance element 100, and couple an upper end of the variable resistance element 100 with a certain line (not shown), for example, a bit line. The memory device in FIG. 6 includes an array of variable resistance elements 100 on the substrate 500 where two elements 100 are shown as examples.

The above memory device may be fabricated by following processes.

First, the substrate 500 in which the transistor is formed may be provided, and then, a first interlayer dielectric layer 510 may be formed over the substrate 500. Subsequently, the lower contact 520 may be formed by selectively etching the first interlayer dielectric layer 510 to form a hole exposing a portion of the substrate 500 and filling the hole with a conductive material. Then, the variable resistance element 100, usually multiple elements 100, may be formed by forming material layers for each variable resistance element 100 over the first interlayer dielectric layer 510 and the lower contact 520, and selectively etching the material layers. A second interlayer dielectric layer 530 may be formed by filling spaces among the variable resistance elements 100 with an insulating material. Then, a third interlayer dielectric layer 340 may be formed over the variable resistance element 100 and the second interlayer dielectric layer 530, and then, the upper contact 550 penetrating through the third interlayer dielectric layer 530 and coupled to the upper end of the variable resistance element 100 may be formed.

In the memory device of this implementation, all layers included in the variable resistance element 100 may have sidewalls aligned with each other. This is because the variable resistance element 100 may be formed by an etching process using a single mask.

However, unlike the implementation of FIG. 6, in some implementations, a portion of the variable resistance element 100 and a remaining portion of the variable resistance element 100 may be patterned separately. This design is exemplarily shown in FIG. 7.

Figure 7:
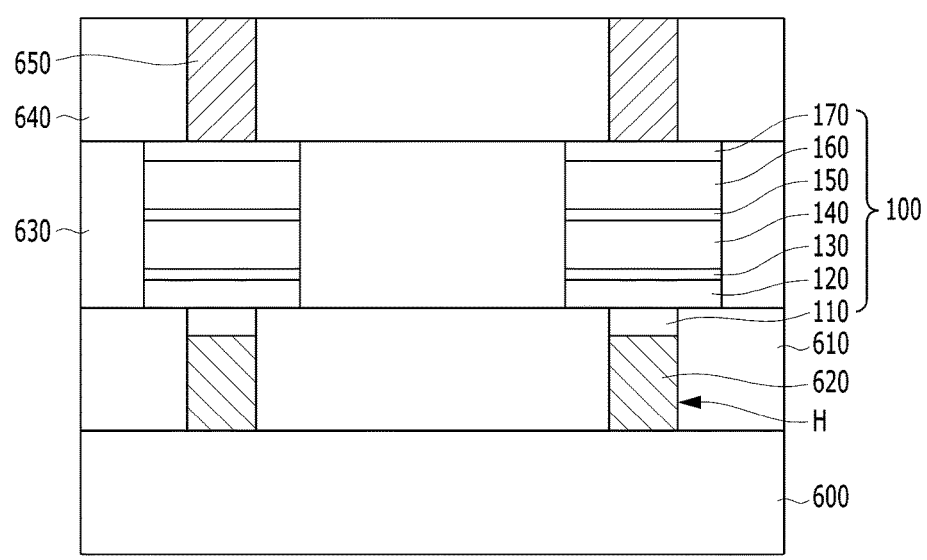
FIG. 7 is a cross-sectional view illustrating a memory device and a method for fabricating the same in accordance with another implementation of the present disclosure.

FIG. 7 is a cross-sectional view illustrating a memory device and a method for fabricating the same in accordance with another implementation of the present disclosure. Differences from the implementation of FIG. 6 will be mainly described.

Referring to FIG. 7, in the memory device of this implementation, a portion of the variable resistance element 100, for example, an under layer 110 may have a sidewall which is not aligned with sidewalls of remaining layers of the variable resistance element 100. The side wall of the under layer 110 may be aligned with a sidewall of a lower contact 620 instead of sidewalls of the meaning layers of the variable resistance element 100.

The above memory device may be fabricated by following processes.

First, a first interlayer dielectric layer 610 may be formed over a substrate 600, and then, a hole H exposing a portion of the substrate 600 may be formed by selectively etching the first interlayer dielectric layer 610. Then, the lower contact 620 filled in a lower portion of the hole H may be formed. Specifically, the lower contact 620 may be formed by forming a conductive material covering a resultant structure in which the hole H is formed, and removing a portion of the conductive material by, for example, an etch back process, until the conductive material has a target height. Then, the under layer 110 filled in a remaining space of the hole H in which the lower contact 620 is formed may be formed. Specifically, the under layer 110 may be formed by forming a material layer which includes a light metal and covers a resultant structure in which the lower contact 620 is formed, and performing a planarization process, for example, a CMP (Chemical Mechanical Polishing) process until a top surface of the first interlayer dielectric layer 610 is exposed. Then, the remaining portion of the variable resistance element 100 may be formed by forming material layers for the remaining layers of the variable resistance element 100, except for the under layer 110, and selectively etching the material layers. Following processes are substantially same as the implementation of FIG. 5.

In this implementation, since a thickness to be etched for forming the variable resistance element 100 decreases, a difficulty of an etching process can be reduced.

In this implementation, it has been described that only the under layer 110 is filled in the hole H but other implementations are also possible. For example, another additional portion of the variable resistance element 100 can be also filled in the hole H.

Figure 8:
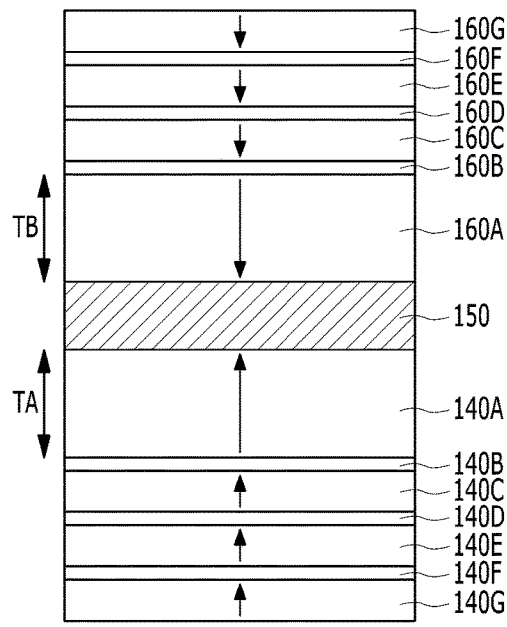
FIG. 8 is a cross-sectional view illustrating examples of a pinned layer, a spacer layer and a magnetic correction layer shown in FIG. 1.

FIG. 8 shows another implementation in which each of the pinned layer 140 and the magnetic correction layer 160 has a multi-layered structure.

FIG. 8 is an exemplary cross-sectional view illustrating the pinned layer, the spacer layer and the magnetic correction layer shown in FIG. 1.

Referring to FIG. 8, the pinned layer 140 may be a synthetic multi-layer structure and may include a plurality of ferromagnetic materials 140A, 140C, 140E and 140G, and spacers 140B, 140D and 140F interposed between the two adjacent ferromagnetic materials.

Here, the spacers 140B, 140D and 140F may serve to provide an exchange coupling among the plurality of ferromagnetic materials 140A, 140C, 140E and 140G and be formed of or include a metallic nonmagnetic material.

The plurality of ferromagnetic materials 140A, 140C, 140E and 140G may have perpendicular magnetization characteristics by an exchange coupling with one another. Here, this exchange coupling may be an exchange coupling with a spring magnet mechanism. Thus, the plurality of ferromagnetic materials 140A, 140C, 140E and 140G may have the same magnetization direction, for example, an upward magnetization direction. That is, the pinned layer 140 may include the plurality of ferromagnetic materials 140A, 140C, 140E and 140G, but serve as a single magnetic dipole.

Similarly, the magnetic correction layer 160 may be a synthetic multi-layer structure and may include a plurality of ferromagnetic materials 160A, 160C, 160E and 160G, and spacers 160B, 160D and 160F interposed between the two adjacent ferromagnetic materials. The plurality of ferromagnetic materials 160A, 160C, 160E and 160G may have the same magnetization directionr, for example, a downward magnetization direction by an exchange coupling with a spring magnet mechanism.

Here, a thickness TA of the ferromagnetic material 140A which is the most adjacent to the spacer layer 150 in the pinned layer 140 may be greater than those of the remaining ferromagnetic materials 140C, 140E and 140G. Moreover, a thickness TB of the ferromagnetic material 160A which is the most adjacent to the spacer layer 150 in the magnetic correction layer 160 may be greater than those of the remaining ferromagnetic materials 160C, 160E and 160G. The reason is that when the pinned layer 140 and the magnetic correction layer 160 are formed with the spacer layer between the two layers 140 and 160, an exchange coupling between the pinned layer 140 and the magnetic correction layer 160 mainly occurs between the layers which are the most adjacent to the spacer layer 150, that is, between the ferromagnetic material 140A and the ferromagnetic material 160A.

The various implementations have been described, which allow to increase an exchange coupling constant Jex between the pinned layer and the magnetic correction layer. By increasing the exchange coupling constant Jex, there can be provided various technical advantages in the electric device having a variable resistance element. For example, since thicknesses of the pinned layer and the magnetic correction layer can be decreased, it is possible to facilitate a patterning process of the variable resistance element and satisfy the required characteristics of the variable resistance element despite decrease in a thickness.

Further, the implementations are not limited to applying a structure in which the pinned layer and the magnetic correction layer are formed on both sides of the spacer layer. The implementations may be used for increasing an exchange coupling between two ferromagnetic materials in case of fabricating a synthetic antiferromagnetic ("SAF") structure in which two ferromagnetic materials are formed on both sides of the spacer layer, respectively.

Thus, when the spacer layer is formed over the cooled substrate, the exchange coupling between two ferromagnetic materials increases. The data on the RMS value of the roughness of the spacer layer, which is shown in FIG. 3, can be also applied to the electronic device with the SAF structure. In some implementations, the spacer layer has a RMS (Root Mean Square) roughness equal to or less than 0.3 nm.

By forming the spacer layer over the cooled substrate, the exchange coupling becomes sufficiently strong such that the magnetic correction layer maintain an anti-parallel state with at least one of the first and second ferromagnetic material. Further, the exchange coupling becomes greater than that generated when the spacer layer has the RMS roughness greater than 0.3 nm. Since the strong exchange coupling is provided between the SAF structure and the magnetic correction layer, a thickness of the SAF structure can be reduced. Thus, the SAF structure has a relatively small size as compared when the spacer layer has the RMS roughness greater than 0.3 nm.

According to the method for fabricating the electronic device in accordance with the implementations described above, characteristics of the variable resistance element can be improved.

The above and other memory circuits or semiconductor devices based on the disclosed technology can be used in a range of devices or systems. FIGS. 9-13 provide some examples of devices or systems that can implement the memory circuits disclosed herein.

Figure 9:
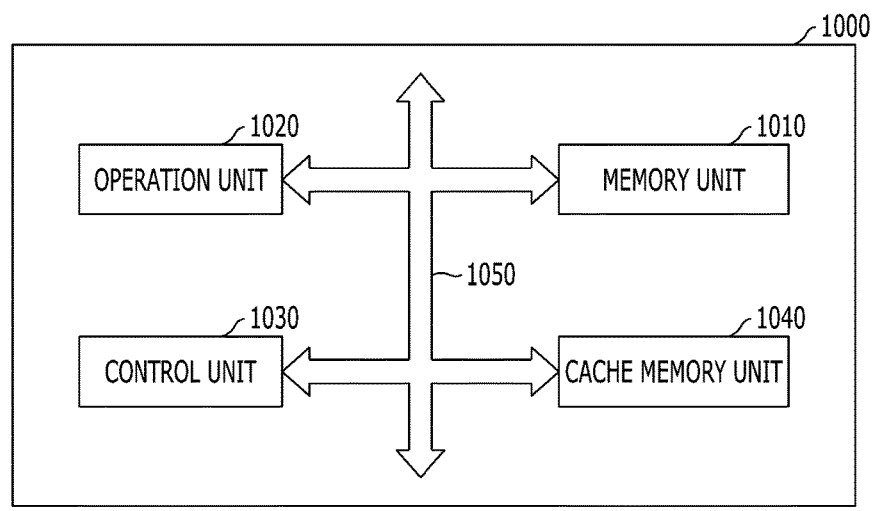
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, such as a processor register, register or the like. The memory unit 1010 may include a data register, an address register, a floating point register and so on. Furthermore, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer. Through this, memory cell characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
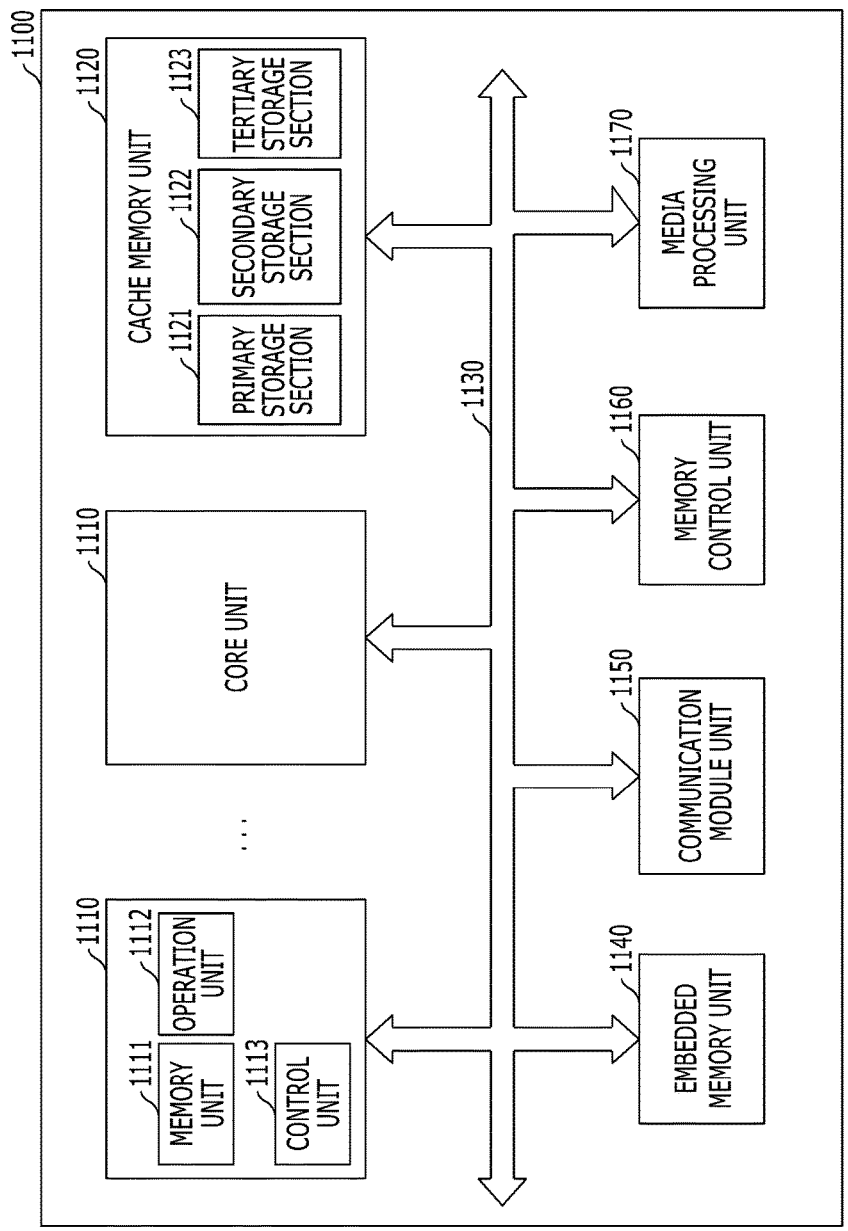
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer. Through this, memory cell characteristics of the cache memory unit 1120 may be improved. As a consequence, operating characteristics of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
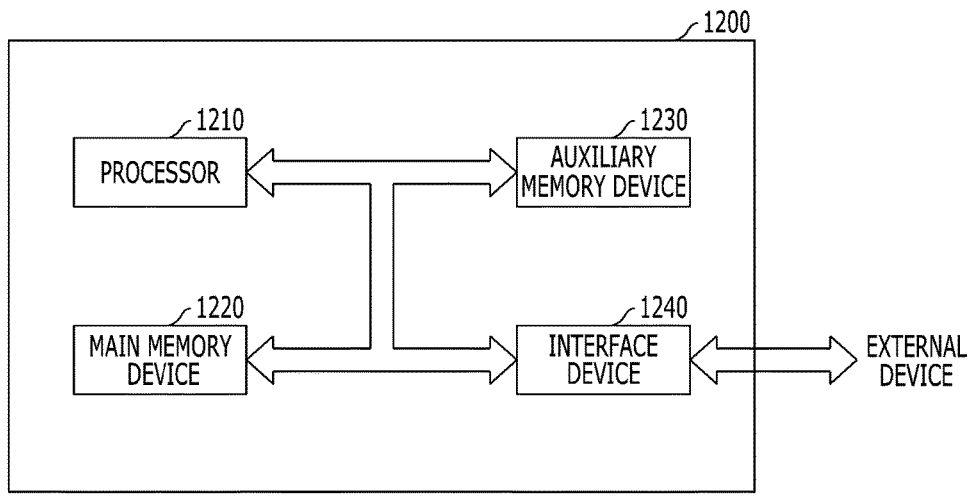
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer. Through this, memory cell characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer. Through this, memory cell characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
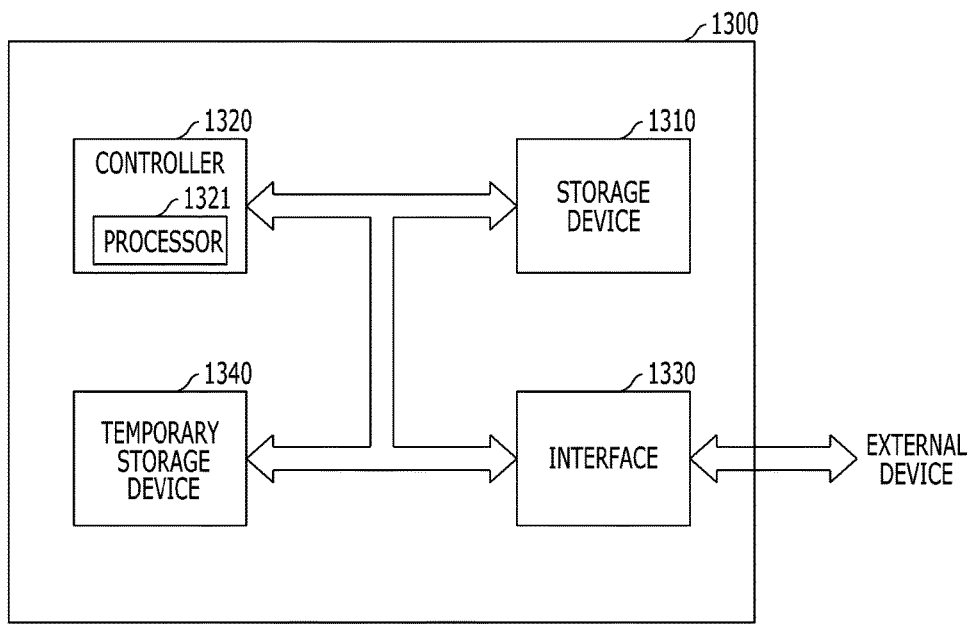
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer. Through this, memory cell characteristics of the storage device 1310 or the temporary storage device 1340 may be improved. As a consequence, operating characteristics and data storage characteristics of the data storage system 1300 may be improved.

Figure 13:
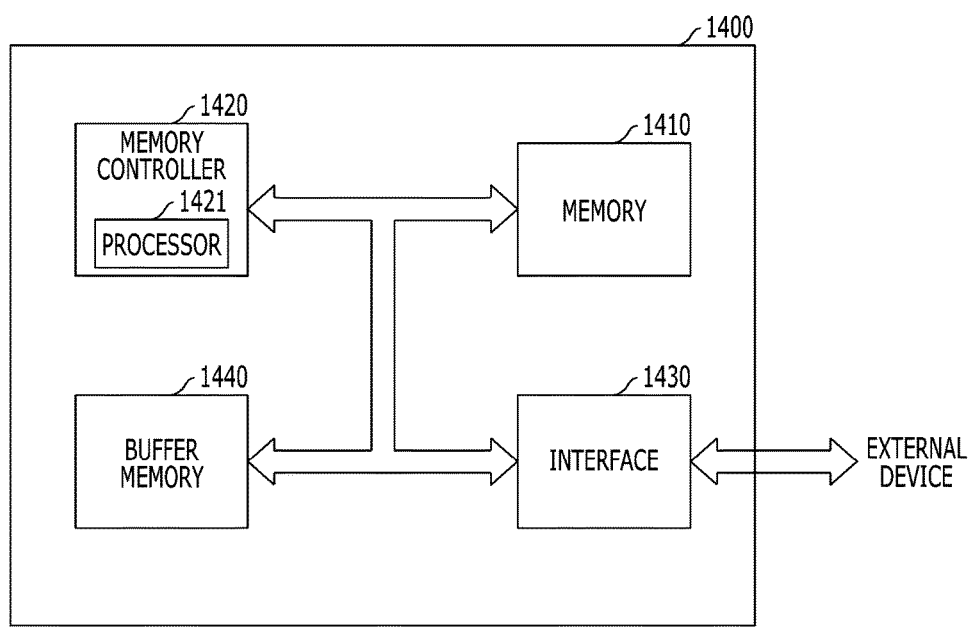
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer. Through this, memory cell characteristics of the memory 1410 may be improved. As a consequence, operating characteristics and memory characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MNIC (eMNIC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a free layer having a variable magnetization direction; a pinned layer having a first non-variable magnetization direction, and including first ferromagnetic materials and a first spacer layer interposed between adjacent two first ferromagnetic materials among the first ferromagnetic materials; a tunnel barrier layer interposed between the free layer and the pinned layer; a magnetic correction layer having a second magnetization direction which is anti-parallel to the first magnetization direction; and a third spacer layer interposed between the magnetic correction layer and the pinned layer, and providing an anti-ferromagnetic exchange coupling between the magnetic correction layer and the pinned layer. Through this, memory cell characteristics of the buffer memory 1440 may be improved. As a consequence, operating characteristics and memory characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a free layer having a variable magnetization direction;
    a pinned layer having a first non-variable magnetization direction, and including first ferromagnetic materials and a first spacer layer interposed between adjacent two first ferromagnetic materials among the first ferromagnetic materials;
    a tunnel barrier layer interposed between the free layer and the pinned layer;
    a magnetic correction layer having a second magnetization direction which is anti-parallel to the first magnetization direction;
    a third spacer layer interposed between the magnetic correction layer and the pinned layer, and providing an anti-ferromagnetic exchange coupling between the magnetic correction layer and the pinned layer; and
    mixing layers formed at interfaces between any two adjacent layers among the free layer, the pinned layer, the tunnel barrier layer, the magnetic correction layer, and the third spacer layer, and
    wherein a thickness of the mixing layer formed at the interface between the third spacer layer and the pinned layer or between the third spacer layer and the magnetic correction layer is smaller than a thickness of each of other mixing layers.

2. The electronic device of claim 1, wherein each of the first ferromagnetic materials has the first magnetization direction.

3. The electronic device of claim 1, wherein the first spacer layer provides an exchange coupling with a spring magnet mechanism between the first ferromagnetic materials.

4. The electronic device of claim 1, wherein a first ferromagnetic material which is the most adjacent to the third spacer layer among the first ferromagnetic materials has a thickness larger than a thickness of each of remaining first ferromagnetic materials.

5. The electronic device of claim 1, wherein the magnetic correction layer includes a plurality of second ferromagnetic materials and a second spacer layer interposed between adjacent two second ferromagnetic materials among the second ferromagnetic materials.

6. The electronic device of claim 5, wherein each of the second ferromagnetic materials has the second magnetization direction.

7. The electronic device of claim 5, wherein the second spacer layer provides an exchange coupling with a spring magnet mechanism between the second ferromagnetic materials.

8. The electronic device of claim 5, wherein
    a second ferromagnetic material which is the most adjacent to the third spacer layer among second ferromagnetic materials has a thickness greater than a thickness of each of remaining second ferromagnetic materials.

9. The electronic device of claim 5, wherein at least one of the first spacer layer, the second spacer layer and the third spacer layer comprises a metallic nonmagnetic material.

10. The electronic device of claim 1, wherein the free layer, the pinned layer and the magnetic correction layer have a magnetization direction perpendicular to surfaces of the layers, respectively.

11. The electronic device according to claim 1, further comprising a processor which includes:
- a core unit configured to perform, based on a command inputted from an outside of the processor, an operation corresponding to the command, by using data;
- a cache memory unit configured to store data for performing the operation, data corresponding to a result of performing the operation, or an address of data for which the operation is performed; and
- a bus interface connected between the core unit and the cache memory unit, and configured to transmit data between the core unit and the cache memory unit,
- wherein the semiconductor memory is part of the cache memory unit in the processor.

12. The electronic device according to claim 1, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside,
- wherein the semiconductor memory is part of the auxiliary memory device or the main memory device in the processing system.

13. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory is part of the storage device or the temporary storage device in the data storage system.

14. The electronic device according to claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside,
- wherein the semiconductor memory is part of the memory or the buffer memory in the memory system.

15. An electronic device comprising a semiconductor memory, wherein the semiconductor memory comprises:
- a free layer having a variable magnetization direction;
- a pinned layer having a first non-variable magnetization direction, and including first ferromagnetic materials and a first spacer layer interposed between adjacent two first ferromagnetic material among the first ferromagnetic materials;
- a tunnel barrier layer interposed between the free layer and the pinned layer;
- a magnetic correction layer having a second magnetization direction which is anti-parallel to the first magnetization direction;
- a third spacer layer interposed between the magnetic correction layer and the pinned layer, and providing an anti-ferromagnetic exchange coupling between the magnetic correction layer and the pinned layer, and wherein a roughness at an interface between the third spacer layer and the pinned layer or between the third spacer layer and the magnetic correction layer is smaller than a roughness at another interface.

16. An electronic device comprising a semiconductor memory, wherein the semiconductor memory comprises:
- a free layer having a variable magnetization direction;
- a pinned layer having a first magnetization direction which is pinned;
- a tunnel barrier layer interposed between the free layer and the pinned layer;
- a magnetic correction layer having a second magnetization direction which is anti-parallel to the first magnetization direction, and including a plurality of second ferromagnetic material layers and a second spacer layer interposed between adjacent two second ferromagnetic material layers among the second ferromagnetic material layers;
- a third spacer layer interposed between the magnetic correction layer and the pinned layer, and providing an anti-ferromagnetic exchange coupling between the magnetic correction layer and the pinned layer; and
- mixing layers formed at interfaces between any two adjacent layers among the free layer, the pinned layer, the tunnel barrier layer, the magnetic correction layer, and the tired spacer layer, and
- wherein a thickness of the mixing layer formed at the interface between the third spacer layer and the pinned layer or between the third space r layer and the magnetic correction layer is smaller than a thickness of each of other mixing layers.

17. The electronic device of claim 16, wherein each of the second ferromagnetic material layers has the second magnetization direction.

18. The electronic device of claim 16, wherein the second spacer layer provides an exchange coupling with a spring magnet mechanism between the second ferromagnetic material layers.

19. The electronic device of claim 16, wherein a second ferromagnetic material layer which is the most adjacent to the third spacer layer among the second ferromagnetic material layers has a thickness greater than a thickness of each of other remaining second ferromagnetic material layers.

* * * * *